(12) United States Patent
Kashiwagi et al.

(10) Patent No.: US 6,992,889 B1
(45) Date of Patent: Jan. 31, 2006

(54) RETENTION MODULE, HEAT SINK AND ELECTRONIC DEVICE

(75) Inventors: Toshiyuki Kashiwagi, Kawasaki (JP); Hirokatsu Katou, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/181,425

(22) PCT Filed: Jan. 25, 2000

(86) PCT No.: PCT/JP00/00347

§ 371 (c)(1),
(2), (4) Date: Nov. 5, 2002

(87) PCT Pub. No.: WO01/56346

PCT Pub. Date: Aug. 2, 2001

(51) Int. Cl.
*H05K 7/20* (2006.01)

(52) U.S. Cl. .............. 361/700; 165/104.33; 165/185; 257/719; 361/704; 361/710; 361/719

(58) Field of Classification Search ............. 174/16.3; 165/80.2, 80.3, 121, 122, 185, 104.33; 257/718–719, 257/726–727, 714–716; 361/697, 694–695, 361/700, 801–802; 439/485
See application file for complete search history.

(56) References Cited

U.S. PATENT DOCUMENTS

| | | | |
|---|---|---|---|
| 5,548,090 A | | 8/1996 | Harris |
| 5,734,550 A | | 3/1998 | Penniman et al. |
| 5,969,940 A | | 10/1999 | Sano et al. |
| 5,991,152 A | * | 11/1999 | Chiou ................. 361/704 |
| 6,046,906 A | * | 4/2000 | Tseng ................. 361/704 |
| 6,243,265 B1 | * | 6/2001 | Wong et al. .......... 361/704 |
| 6,269,863 B1 | * | 8/2001 | Wyler ................. 165/80.3 |
| 6,327,147 B1 | * | 12/2001 | Llapitan et al. ....... 361/704 |
| 6,449,163 B1 | * | 9/2002 | Stark et al. .......... 361/752 |

FOREIGN PATENT DOCUMENTS

| | | |
|---|---|---|
| EP | 834795 A1 | 4/1998 |
| JP | 07-283351 | 10/1995 |
| JP | 10-224060 | 8/1998 |
| JP | JUM 3054346 | 9/1998 |
| JP | 10-340138 | 12/1998 |
| JP | JUM 3057411 | 2/1999 |
| JP | 11-143585 | 5/1999 |
| JP | 11-312883 | 11/1999 |
| WO | WO96/42044 | 12/1996 |

* cited by examiner

*Primary Examiner*—Gregory Thompson
(74) *Attorney, Agent, or Firm*—Westerman, Hattori, Daniels & Adrian LLP (57) ABSTRACT

It is an object of the present invention to provide a retention module, a heat sink and electronic apparatus for effectively the heat from a chip set. The retention module for a CPU is provided with a heat sink for the chip set.

12 Claims, 11 Drawing Sheets

RETENTION MODULE, HEAT SINK AND ELECTRONIC DEVICE

FIELD OF THE ART

The present invention relates generally to heat radiator mechanisms, and more particularly to a heat radiator mechanism for radiating the heat from a circuit element mounted in an electronic apparatus. The present invention is suitable for a retention module (also referred to as a CPU socket, a retention kit or a retention tool) for electrically connecting a CPU to a motherboard and for fixing the CPU onto the motherboard, and the inventive electronic apparatus broadly covers personal computers (PCs) of desktop type including a tower type, measurement devices, control devices, and the like.

BACKGROUND OF THE INVENTION

A CPU (Central Processing Unit) in a computer handles data inputs/outputs, executes commands, controls each component, and thus directly affects computer performance. A current CPU uses a laterally long and wide cartridge called Slot 1 Type as seen in U.S. Intel Pentium II.

A computer exhibits higher performance as it mounts a higher CPU; the heating value increases as the CPU performance improves. Accordingly, a heat sink as one cooling device is provided near the CPU to thermally protect the CPU. The heat sink has cooling fins near the CPU and radiates the heat from it through natural cooling. For example, the CPU in the desktop type computer is typically fixed onto and connected electrically to a motherboard.

The retention module typically includes a holding part for mechanically fixing the CPU onto a motherboard, and a slot that may be engaged with a card edge connector as a CPU terminal and electrically connected to the motherboard. Therefore, when the CPU is held by the holding part and the card edge connector is inserted into the slot, the CPU is electrically connected to the motherboard through the retention module.

The motherboard is provided with various circuit elements including a memory (socket), chip set, extension slot, and BIOS ROM, as well as the CPU. The chip set is a circuit element group for controlling data transmissions and receptions among the CPU, memory, such as a RAM, and extension card in the computer. The performance of the chip set has been improved as the CPU. Intel 440BX, 440ZX, 810 chip sets are currently known, and there are various chip sets for CPUs, videos, and peripherals. Among them, the CPU chip set, which is typically provided between the CPU and the memory, serves to connect the CPU and memory, and control a data flow between the CPU and memory.

SUMMARY OF THE INVENTION

However, as the chip set has more improved performance, influence of the heating value from the chip set, which was conventionally negligible, has become non-negligible. As the heating value of the CPU increases, the heat from the CPU greatly affects the chip set near the CPU. Therefore, the protection of the chip set from thermal malfunctions and damages has needed a heat radiator means for the chip set, which was not required conventionally. In particular, the chip set for the CPU should be located near the CPU and memory in a congested space for controls over communications between them, and this congested space sterilizes the natural cooling effect: There has been needed an effective heat radiator means. Circuit elements are expected to be closer and closer in the future along with the progress of the high integration of the motherboard.

Accordingly, it is a general object of the present invention to provide a novel and useful retention module, heat sink and electronic device in which the above disadvantages are eliminated.

More specifically, the present invention has an exemplary object to provide a retention module, heat sink and electronic device which radiates the heat from the chip set effectively, easily and cost-efficiently.

In order to achieve the above objects, a retention module of one aspect of the present invention includes a holding part for holding a CPU, a first connecting part connectible thermally to a chip set that is connectible electrically to the CPU, and a heat conduction part, connected to the first connecting part, for transmitting heat from the chip set to the outside. This retention module serves to radiate the heat from the chip set.

A circuit structure of another aspect of the present invention includes a substrate, first and second exoergic circuit elements connectible electrically to each other through the substrate, a holding mechanism for fixing the first circuit element onto the substrate and for electrically connecting the first circuit element to the substrate, a first heat radiating part, connected to the holding mechanism, for radiating heat from the first circuit element, and a second heat radiating part, connected to the holding mechanism, for radiating heat from the second circuit element. This circuit structure radiates heat from the first and second circuit elements using the first and second heat radiating parts.

A heat sink of one aspect of the present invention includes a connecting part connected to a chip set, and a heat conduction part, connected to the connecting part, for transmitting heat from the chip set to the outside. This heat sink serves to radiate the heat from the chip set.

An electronic apparatus of another aspect of the present invention includes a housing, a substrate housed in the housing, a CPU provided on the substrate, a memory for communicating with the CPU, a chip set, provided on the substrate between the CPU and memory, for controlling operations of the CPU and memory, a retention module for fixing the CPU onto the substrate and for electrically connecting the CPU to the substrate, wherein the retention module includes a first connecting part connected to a chip set, and a heat conduction part, connected to the first connecting part, for transmitting heat from the chip set to the outside. This electronic device exhibits similar operations as those of the above retention module.

An electronic apparatus of another aspect of the present invention includes a housing, a substrate housed in the housing, first and second exoergic circuit elements connectible electrically to each other through the substrate, a holding mechanism for fixing the first circuit element onto the substrate and for electrically connecting the first circuit element to the substrate, a first heat radiating part, connected to the holding mechanism, for radiating heat from the first circuit element, and a second heat radiating part, connected to the holding mechanism, for radiating heat from the second circuit element. This electronic apparatus uses the first and second radiating parts to radiate heat from the first and second circuit elements.

Other objects and further features of the present invention will become readily apparent from the following description of the embodiments with reference to accompanying drawings.

BRIEF DESCRIPTION OF THE DRAWINGS

FIG. 13 is a schematic perspective view of the retention module as a modification shown in FIG. 1 having a straight type slot 120a.

DETAILED DESCRIPTION OF PREFERRED EMBODIMENT

Figure 1:
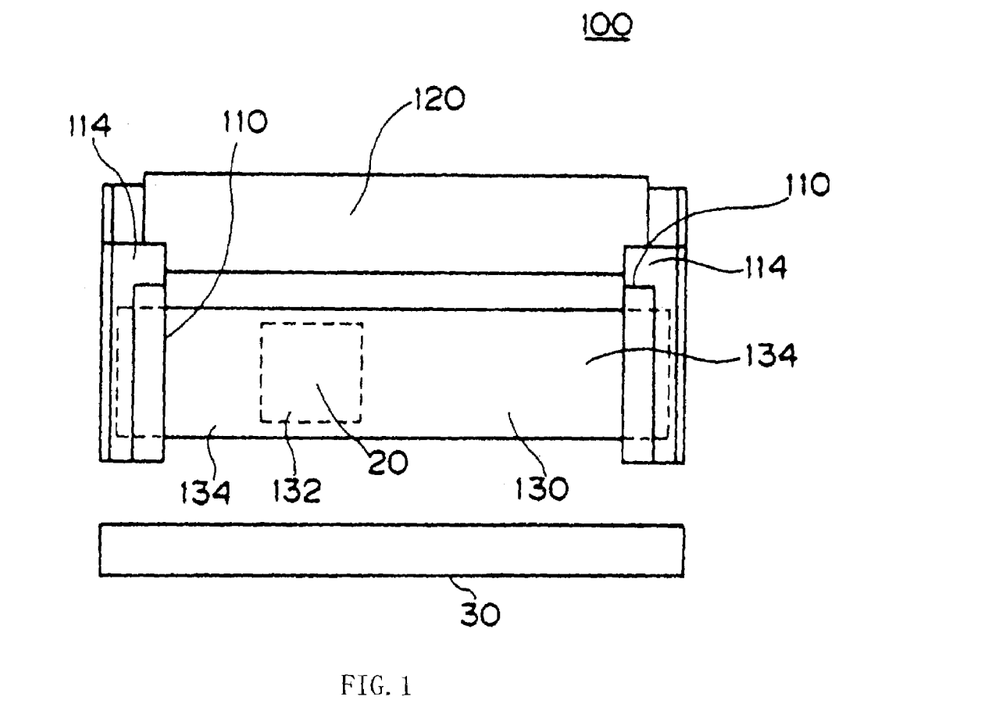
FIG. 1 is a schematic plane view of a retention module before a CPU and a fan heat sink are mounted.
Figure 2:
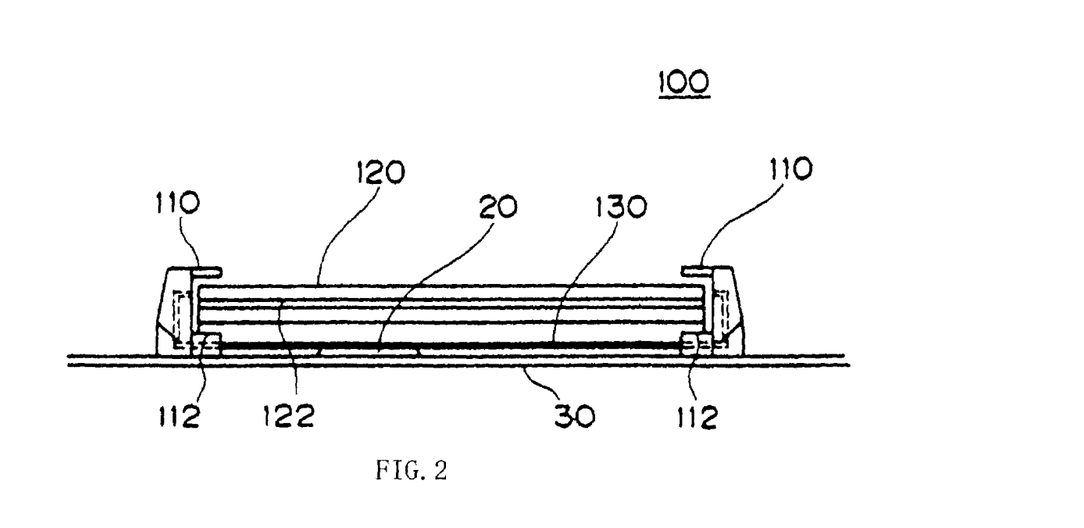
FIG. 2 is a schematic sectional view of the retention module shown in FIG. 1.
Figure 3:
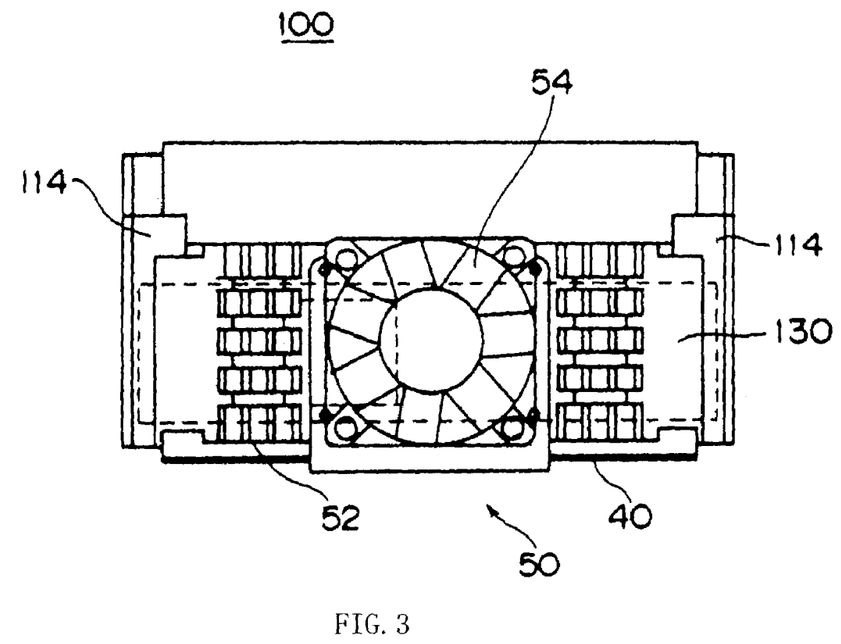
FIG. 3 is a schematic plane view of a retention module after the CPU and fan heat sink are mounted.
Figure 4:
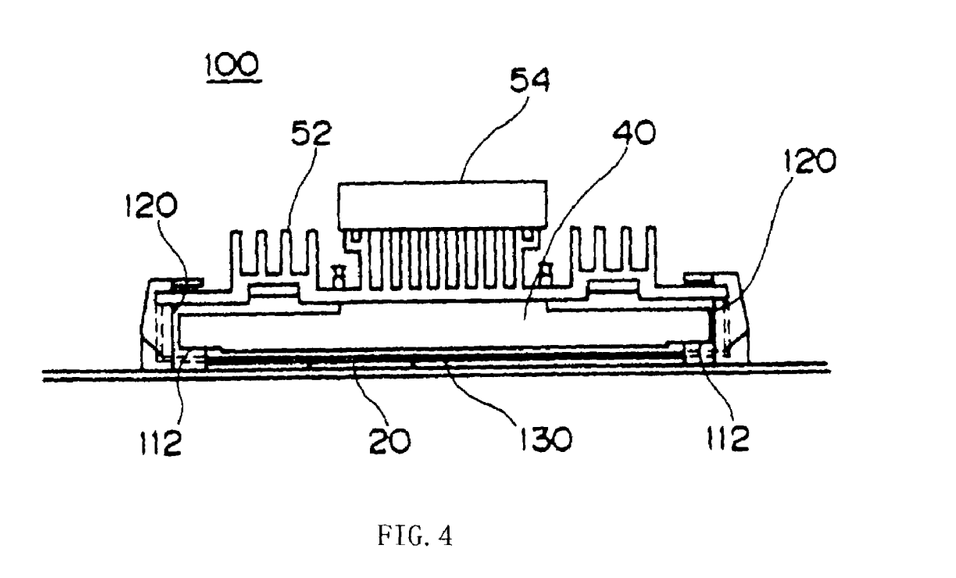
FIG. 4 is a schematic sectional view of the retention module shown in FIG. 3.
Figure 5:
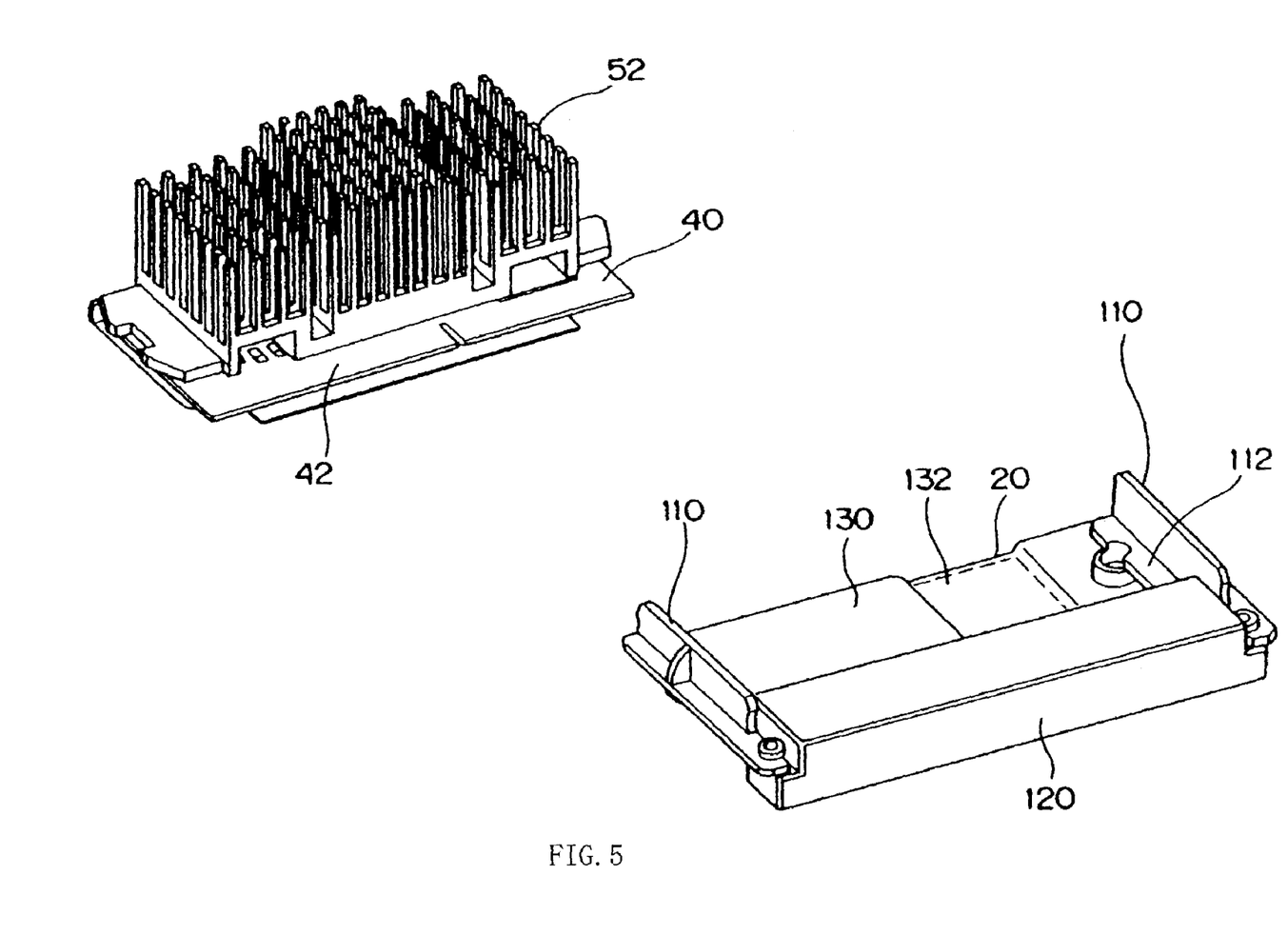
FIG. 5 is an exploded view for explaining an engagement between the CPU and retention module.
Figure 6:
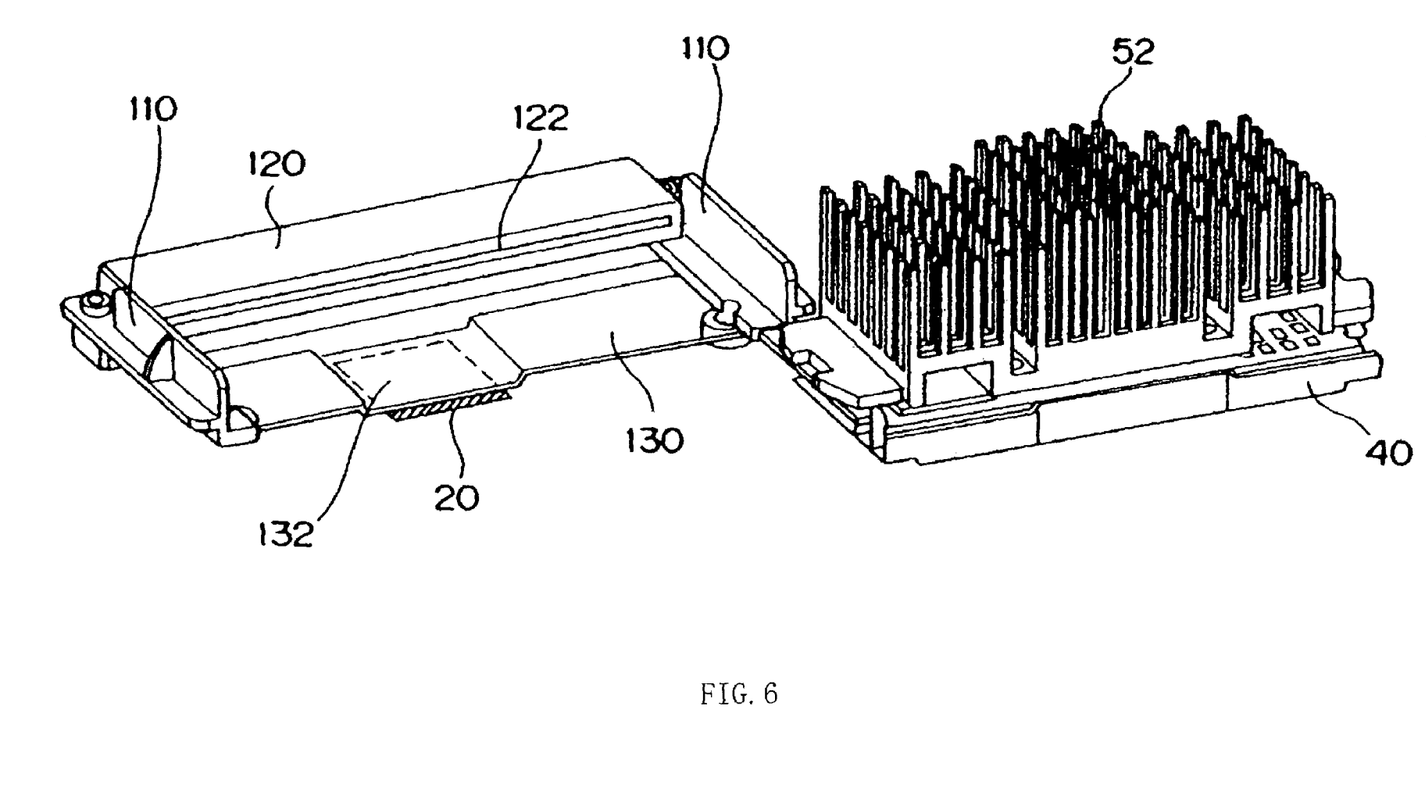
FIG. 6 is another exploded view viewing FIG. 5 at a different angle.

A detailed description will now be given of an embodiment according to the present invention with reference to FIGS. 1–4. FIG. 1 is a schematic plane view of a retention module 100 before a CPU 40 and a fan heat sink 50 are mounted. FIG. 2 is a schematic sectional view of the retention module 100 shown in FIG. 1. FIG. 3 is a schematic plane view of the retention module 100 after the CPU 40 and fan heat sink 50 are mounted. FIG. 4 is a schematic sectional view of the retention module 100 shown in FIG. 3. FIGS. 5 and 6 are exploded views for explaining an engagement among the CPU 40, cooling fins 52 (without a fan) and retention module 400, viewed from different angles.

The retention module 100 electrically connects the CPU 40 to the motherboard 30, and includes a pair of standing holding parts 110, slot 120, heat sink 0.130, and connecting part 136. This embodiment mounts the retention module 100 onto the motherboard 30 in a desktop type PC 200 as one example of an electronic apparatus. The holding part 110 includes a stand 112 onto which the CPU 40 may be placed, as shown in FIG. 2. The stand 112 is not necessarily provided because the CPU 40 may be placed on the heat sink 130 as described later. The holding part 110 is connected to the slot 120 and heat sink 130, and made of plastic. The connecting part 136 is provided in the holding part 110 and thermally connected to the heat sinks 130 and 50.

Although the connecting part 110 has an approximately exemplary L shape in FIGS. 1 and 3, a projection 114 is omitted in FIGS. 5 and 6. The holding part 110 accommodates the CPU 40 to fix it laterally, and protects it from impacts. The holding part 110 guides an engagement between the card edge connector 42 and the slot 120, which will be described later, and prevents the connector 42 from deteriorating due to load (or stress). Optionally, the holding part 110 may be engaged with the attachment 156 and may fix the CPU 40 and fan heat sink 50 in the height direction, as will be described with reference to FIGS. 7 and 8.

The slot 120 has an opening 122 that is engageable with the card edge connector 42 of the CPU 40. The opening 122 is provided with a terminal (not shown) that is connectible to the connector 42, and electrically connected to the motherboard 30. The CPU 40 is thus electrically connected to the motherboard 30 through an engagement between the card edge connector 42 and the slot 120. As the CPU 40 has a laterally long and wide Single Edge Connector Cartridge ("SECC") shape universally used for Intel Pentium II and III, the slot 120 exemplarily has a Slot 1 shape corresponding to it. The Slot 1 arranges the terminal in the opening 122 parallel to the motherboard 30 (such a slot is sometimes called "right angle type"), but may arrange the terminal perpendicular to the motherboard 30 as will be described with reference to FIG. 13 (such a slot is sometimes called "straight type").

In FIGS. 1–4, the chip set 20 is exemplarily located between the CPU 40 and motherboard 30. In general, the chip set is a circuit group for controlling data transmissions and receptions among a CPU, a memory such as a RAM, and an extension card in a computer, and there are various chip sets for CPUs, videos, and other peripherals. Exemplarily, the chip set 20 is a CPU chip set in this embodiment, and controls data flows between the CPU 40 and memory which will be described and referenced later. The recent chip set has improved performance as seen in 440BX, and thus considerable heating value. The inventive retention module 100 is not limited to that for the CPU, but may have a heat radiating mechanism for the chip set 20 having the retention module 60 (or memory socket 60) for a memory, which will be described with reference to FIG. 7, etc.

The heat sink 130 contacts the chip set 20, transmits the heat from the chip set 20 through the holding part 110 to the heat sink 50, and radiates the heat by enlarging the surface area of the chip set 20. Specifically, the heat sink 130 is thermally connected to the connecting part 136 provided in the holding part 110, and transmits the heat from the chip set 20 to the heat sink 50 through the connecting part 136. The heat sink 50 is equipped with a fan 54 that may compulsorily cool the cooling fins 52.

Referring to FIGS. 3 and 4, the heat sink 50 as a cooling device for the CPU 40 is provided on the CPU 40 as the CPU 40 has increased performance and thus increased heating value. The heat sink 50 has the cooling fins 52 and cooling fan 54, and projects from the retention module 100. This embodiment uses a so-called PGA package that arranges a plurality of pins for the CPU 40. Alternatively, the CPU 40 may use a shape (for example, Pentium II) wholly housed in a resin case. The inventive retention module 100 is applicable both shapes of CPU 40.

Figure 12:
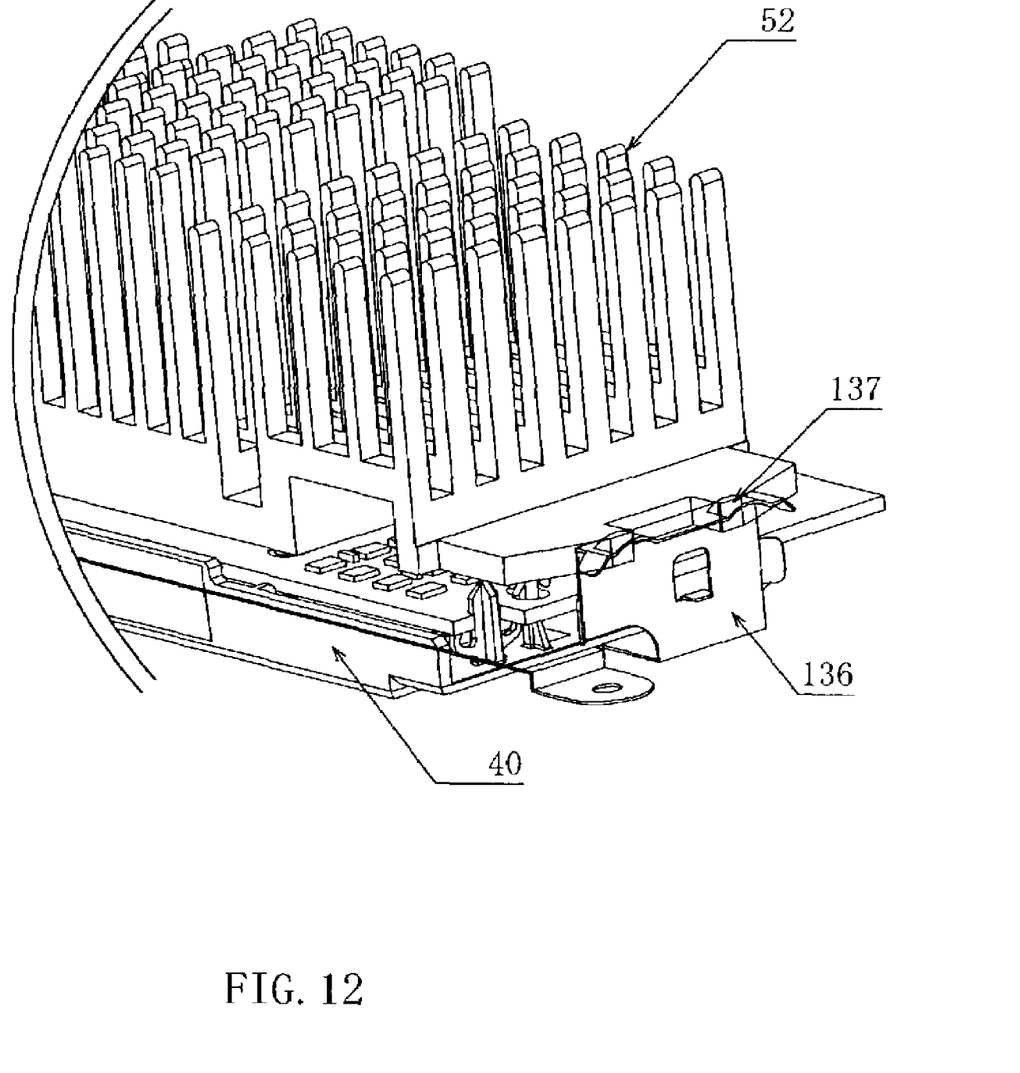
FIG. 12 is a partially enlarged perspective view of the retention module shown in FIG. 9 for explaining thermal connection between the chip-set heat sink and CPU heat sink.

The cooling fins 52 includes, as shown in FIG. 12, a multiplicity of heat radiating fins arranged like a frog, enlarging the surface area of metal fins and enhancing radiating performance. Here, FIG. 12 is a partially enlarged perspective view of the retention module 100 for explaining thermal connections between the heat sink 130 and cooling fins 52. As a result, the cooling fins 52 effectively radiate the heat from the CPU 40 and chip set 20 through natural cooling. The cooling fan 54 is also called a CPU cooler, and uses a fan to compulsorily radiate the heat so as to thermally protect the CPU 40. It is understood that the compulsory cooling by the cooling fan 54 has the highest radiating effect.

Figure 7:
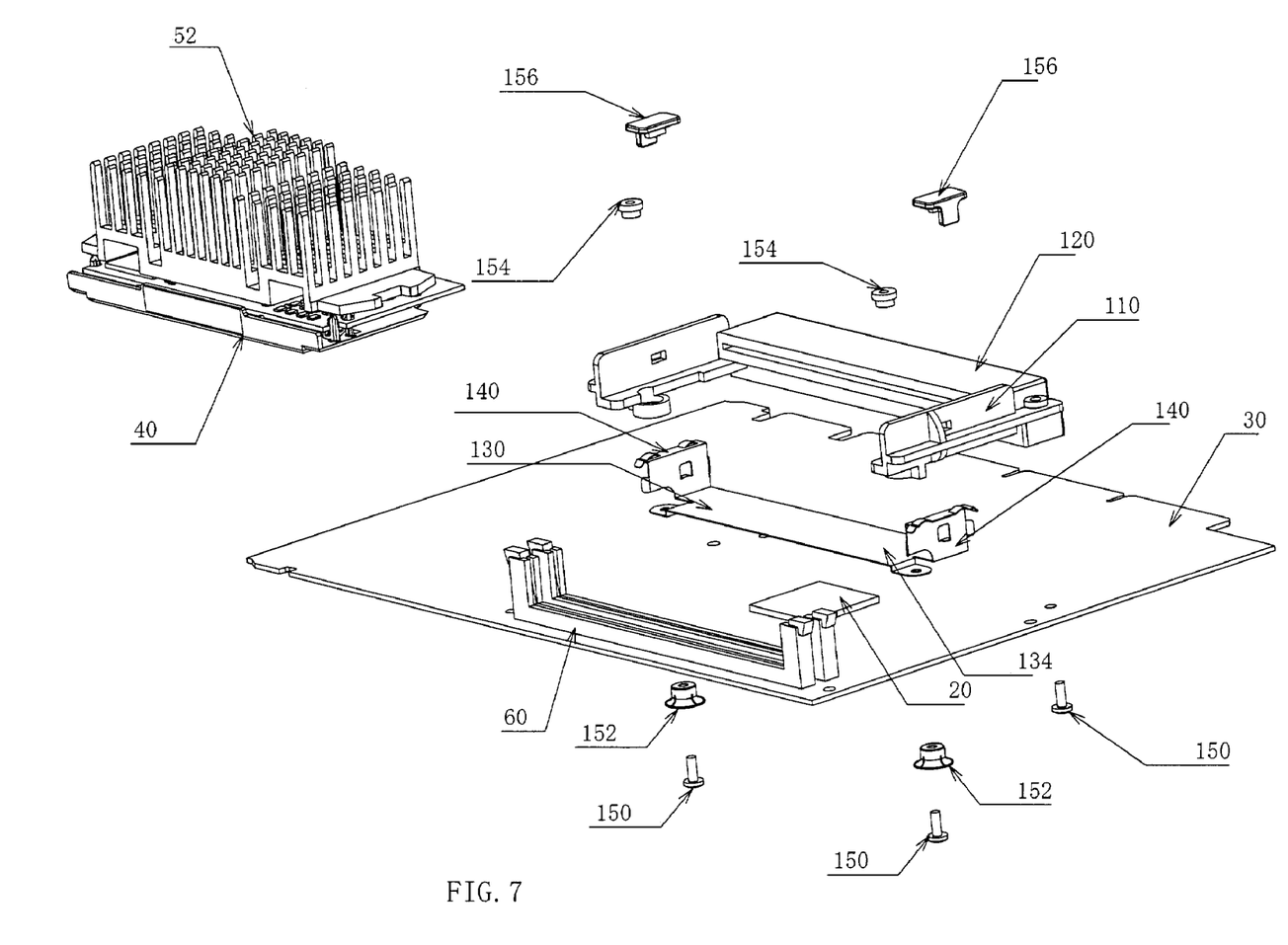
FIG. 7 is an exploded view of the retention module and its peripheral on a motherboard.

The heat sink 130 includes the connecting part 132 that contacts the chip set 20, the heat conduction part 134 that transmits the heat from the chip set 20, the connecting part 136 connected to the heat conduction part 134 and the heat sink 50. In FIGS. 1–4 and 7, the connecting part 132 and the heat conduction part 134 exemplarily has a plate shape, but the connecting part 132 is configured to be concave (or convex), as shown in FIGS. 5 and 6, relative to the heat conduction part 134 so that it may surely contact the top surface of the chip set 20 with predetermined pressure. The convex connecting part 132 preferably has a size enough to accommodate the chip set 20. Here, FIG. 7 is an exploded view of the retention module 100 and its peripheral circuit elements.

As the heat conduction part 132 contacts or is located near the CPU 40, it also serves to transmit the heat from the CPU 40 to the heat sink 50 via the connecting part 132. At this time, as needed, a heat insulating material may be provided between the CPU 40 and the connecting part 132 so as to prevent the heat from the CPU 40 to be transmitted to the chip set 20 through the heat conduction part 134. Understandably, the heat conduction part 132 serves to stably hold the CPU 40. The heat sink 130 is made of materials having high thermal conductivity such as aluminum.

This embodiment integrates, as shown in FIG. 7, the connecting part 136 and the heat conduction part 134 into one member, but may produce them as independent members. The connecting part 136 of this embodiment is formed by bending a metal plate shape of heat sink 130. Specifically, as shown in FIG. 12, the connecting part 136 has a contact part 137 connected to the cooling fins 52. In other words, the connecting part 136 is thermally coupled with the cooling fins 52 through the contact part 137. The contact part 137 has a plate spring shape so that it may surely contacts the cooling fins 52. Unlike the instant embodiment, the heat sinks 50 and 130 and the connecting part 136 may be formed as one member.

Figure 8:
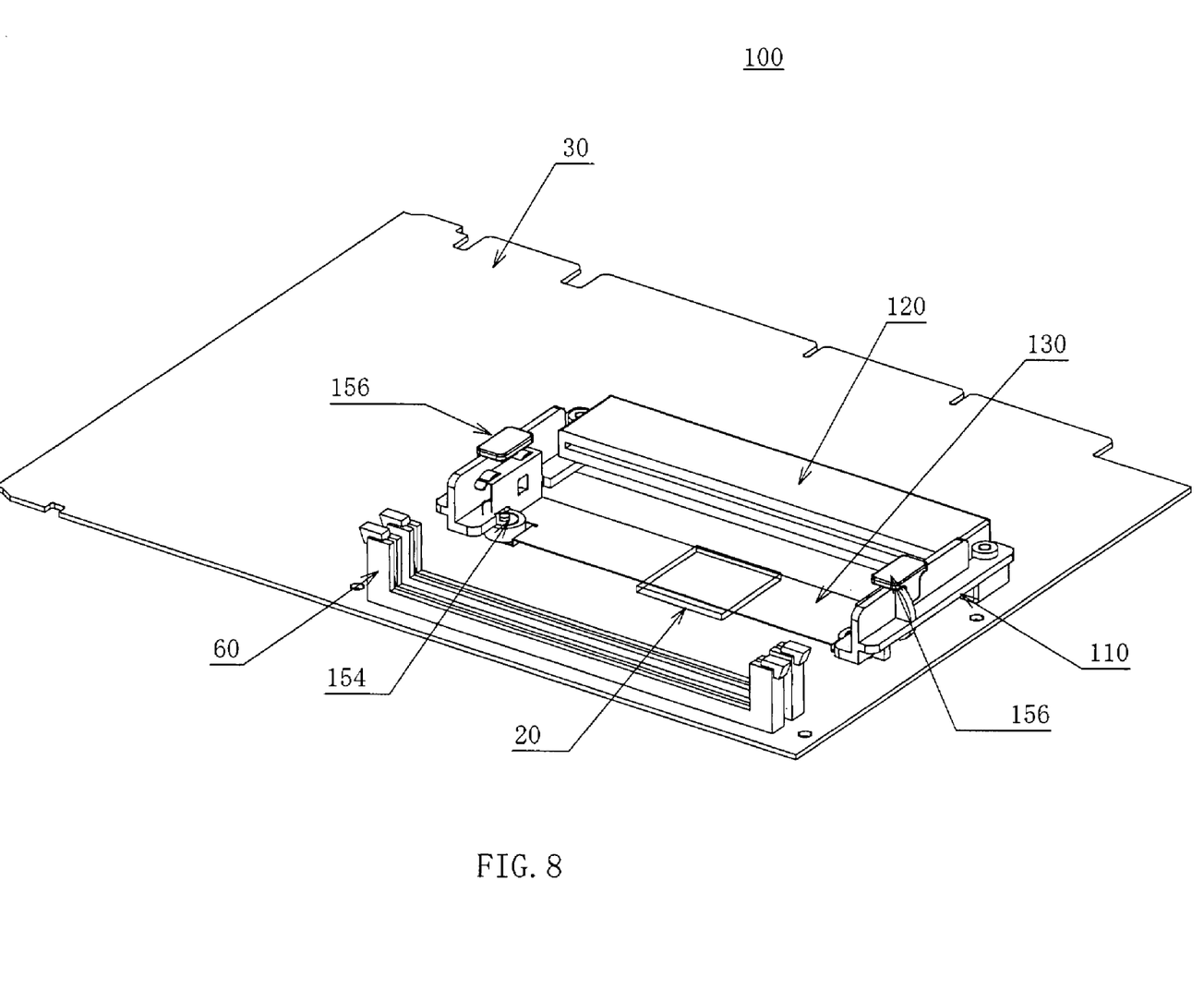
FIG. 8 is a schematic perspective view of the retention module before the CPU and fan heat sink are mounted.
Figure 9:
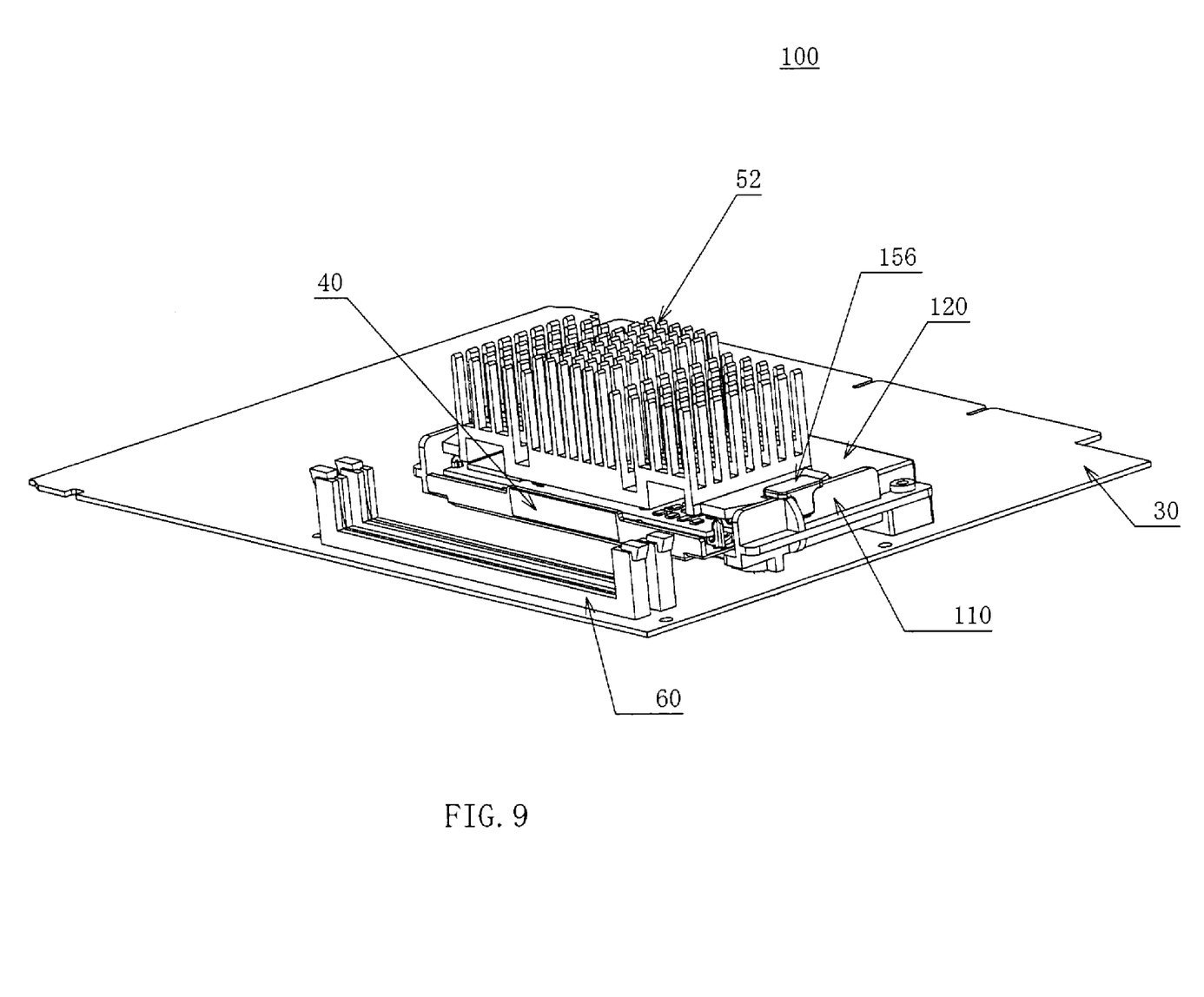
FIG. 9 is a schematic perspective view of the retention module after the CPU and fan heat sink are mounted.

Referring now to FIGS. 7–9, a description will be given of a mounting method of the retention module 100 and the CPU 40. Here, FIG. 8 is a schematic perspective view of the retention module 100 and its peripherals on the motherboard 30 before the CPU 40 and fan heat sink 50 are mounted. FIG. 9 is a schematic perspective view of the retention module 100 and its peripherals on the motherboard 30 after the CPU 40 and fan heat sink 50 are mounted. In FIGS. 7–9, the retention module 100 places the CPU 40 on the heat sink 130, not the stand 112 shown in FIG. 2, etc.

Referring to FIG. 7, the heat sink 130 is fixed onto the holding part 110 through screws 150, springs 152, and screw fixtures 154. The spring 152 serves to absorb an assembly error between the heat sink 130, chip set 20 and holding part 110. The heat sink 130 and holding part 10 are attached before or after the heat sink 130 is positioned and fixed onto the chip set 20. The screw 150 and spring 152 fix the heat sink 130 and the holding part 110 onto the motherboard 30 from the rear side of the motherboard 30. FIG. 8 shows this state. As understood from FIG. 8, the holding part 110 is engaged with the attachment 156. The holding part 110 fixes the CPU 40 and the fan heat sink 50 in the height direction through an engagement with the attachment 156. Then, the CPU 40 and fan heat sink 50 are mounted onto the retention module 100 (although FIG. 7 omits the cooling fan 54). FIG. 9 shows this state.

FIGS. 7–9 show the retention module 60 (or memory socket 60) for use with a memory. The memory socket 60 is a socket to be coupled with the memory module (not shown), enabling a user to exchange or expand a secondary cash or main memory (or master storage) as a module. The module for the main memory includes, for example, 72-pin SIMM and 168-pin DIMM, but its type is different according to computer types. The memory stores various kinds of information for the computer including programs and data and, in general, the main memory is often called a memory simply. The memory that the CPU 40 directly accesses is usually the main memory, and the computer processes by reading data and program(s) from the external storage to the main memory. The chip set 20 controls data flows between the CPU 40 and the memory to be inserted into the memory socket 60.

The inventive heat radiating means for the chip set 20 is not limited to the heat sink 50. For example, the heat sink 50 may be thermally connected to the external radiating means other than the heat sink 130. Alternatively, heat radiating/heat conduction means, whether it is a heat pipe, another cooling or water-cooling system, may be provided instead of or in addition to the heat sink 50. The heat pipe has a pipe shape having a difference of elevation for accommodating liquid, such as water. The heat pipe cools the exoergic member by repeating a cycle in which the water vaporizes and moves to a high position when receiving the heat from the exoergic member at a low position, and returns to the low position after cooled by naturally or compulsorily and liquidized.

Figure 10:
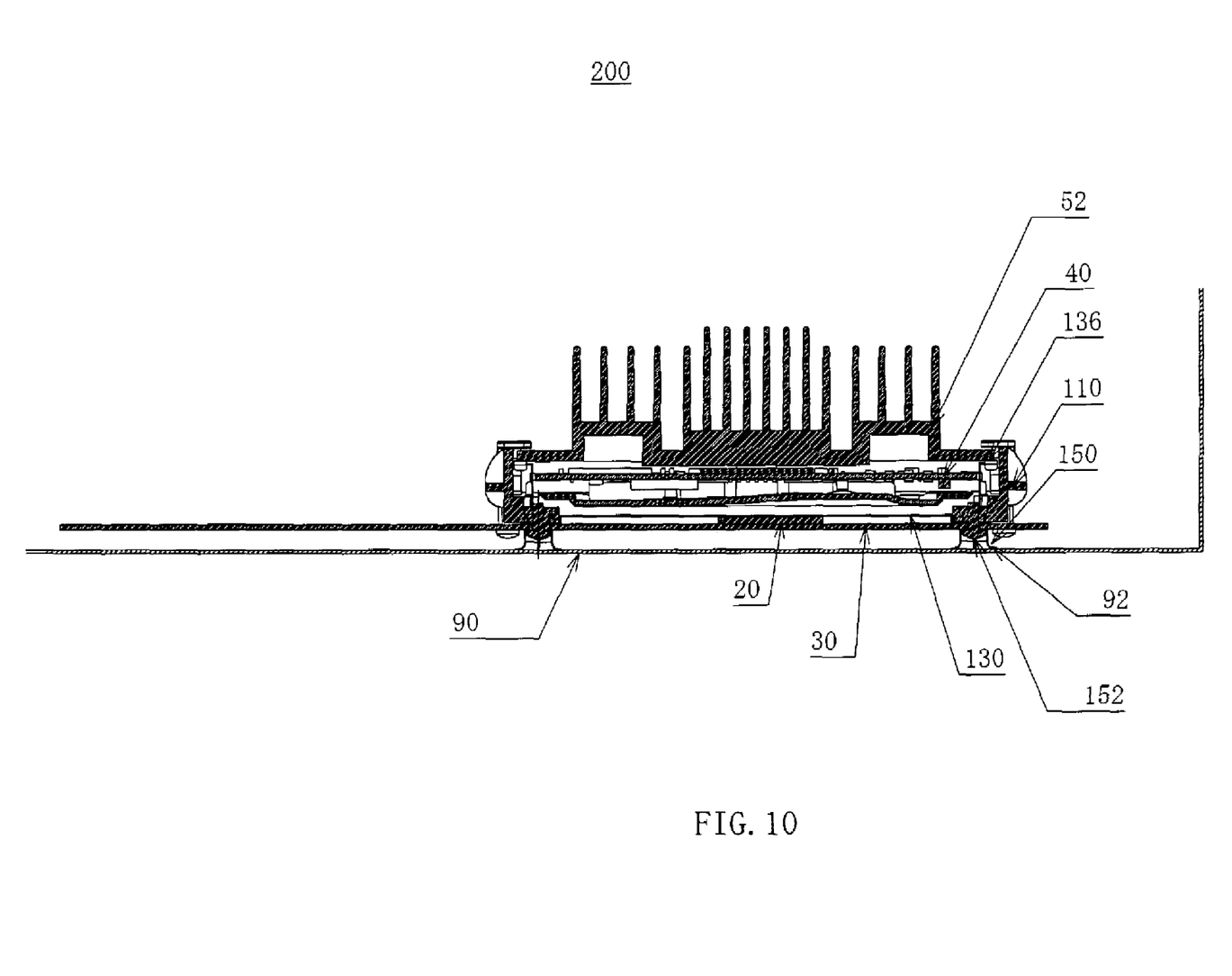
FIG. 10 is a schematic and partial section for explaining a method for radiating the heat from the chip set using the retention module provided in the desktop type personal computer.
Figure 11:
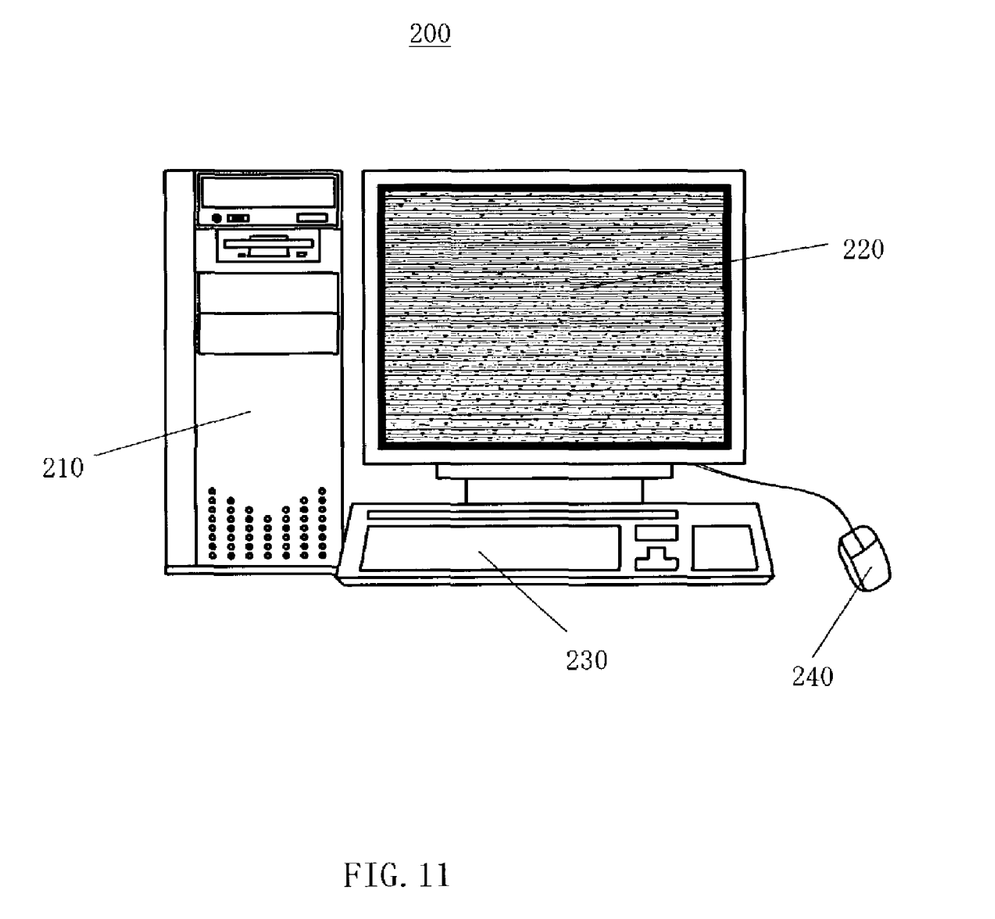
FIG. 11 is a schematic perspective view of the desktop type personal computer shown in FIG. 10.

When the motherboard 30 with the retention module 100 that holds the CPU 40 is installed in the desktop type PC 200, part of the heat from the chip set 20 is transmitted to the sheet metal 90 in the PC 200 for heat radiation purposes, as shown in FIGS. 10 and 11. Here, FIG. 10 is a schematic and partially section for explaining a method for radiating the heat from the chip set 20 using the retention module 100 installed in the desktop type PC 200. FIG. 11 is a schematic perspective view of the desktop type PC 200 shown in FIG. 10. The sheet metal may be provided as an independent member in the housing.

As shown in FIG. 11, the desktop type PC 200 includes a tower type body 210, a display 220, a keyboard 230, and a mouse 240. The body 210 is made of sheet metal housing 90.

Referring to FIG. 10, the heat from the chip set 20 is radiated after transmitted to the heat sink 50 through the connecting part 136 in the heat sink 130. Part of the heat from the chip set 20 is dissipated in the air from the surface of the heat conduction part 134. The motherboard 30 is housed in the sheet metal housing 90 as a body case of the PC 200. Here, when the screw 150 and spring 152 are formed as a heat conduction member, the heat sink 130 is (thermally) connected to the sheet metal housing 90 through a contact 92. As a result, part of the heat from the chip set 20 is transmitted to and radiated by the sheet metal housing 90 at the contact 92 through the screw 150 and spring 152. Thus, the heat from the chip set 20 may be effectively radiated using multiple radiating means.

Figure 13:
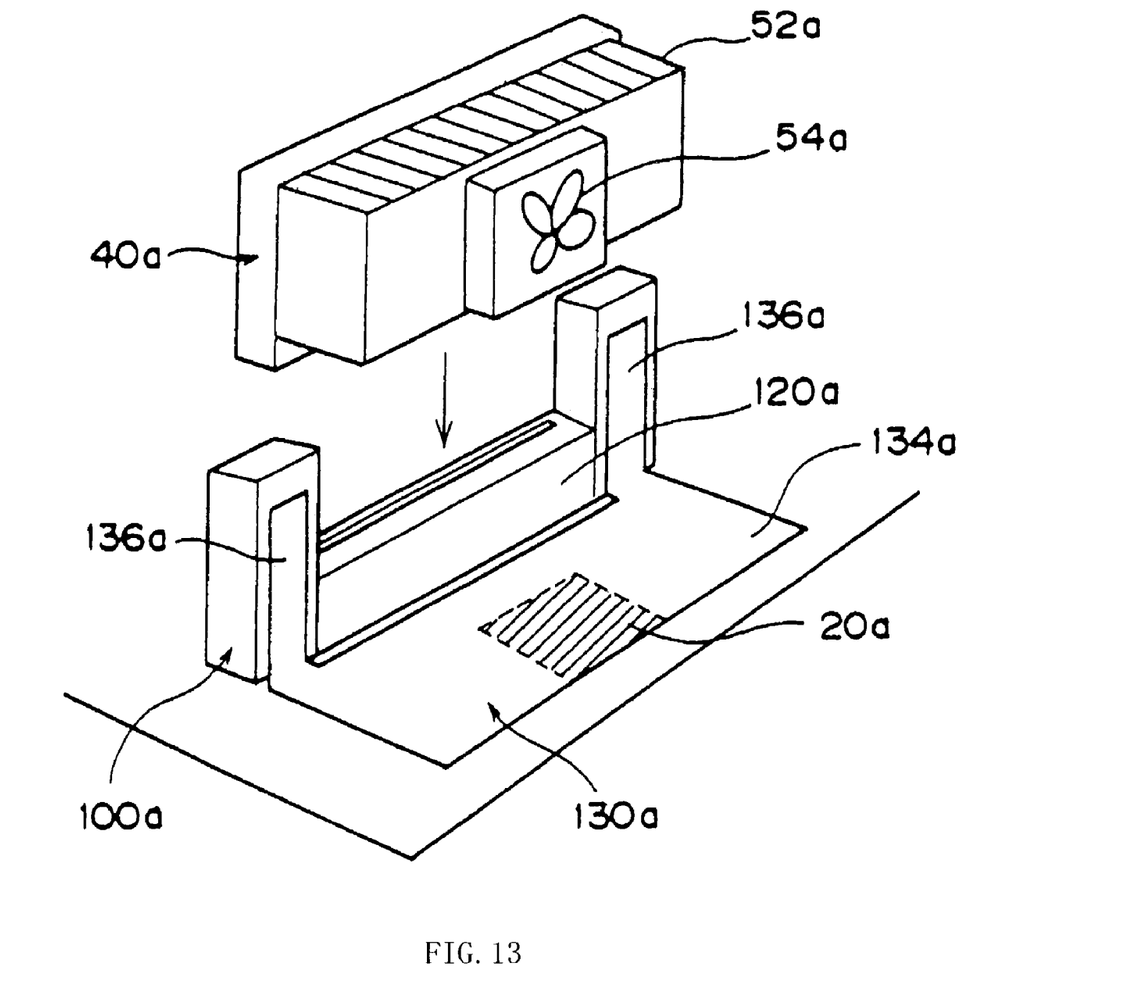

The above right angle type slot 120 may be replaced with the straight type slot 120a as shown in FIG. 13. Here, FIG. 13 is a schematic perspective view of the retention module 100a having the straight type slot 120a. Characteristically, the retention module 100a has the slot 120a and heat sink 130a, and the slot 120a arranges its connection part (opening 122a) with the card edge connector 42a of the CPU 40a (not shown), perpendicular to the motherboard 30a. The heat sink 130a has the connecting part 134a connected to the top surface of the chip set 20a, and is connected to the cooling fins 52a at the connecting part 136a. The chip set 20a is not covered with the CPU 40*a* and thus appears to be naturally cooled. However, it is located in a packed space between the retention module 100*a* and memory socket 60*a* (not shown), and thus the heat sink 130 is still effective when there is no smooth air convection. Moreover, as discussed, the memory socket 60*a* (not shown) may have a cooling mechanism for the chip set 20*a* instead of or in addition to the heat sink 130*a*. The reference numeral with no alphabetical character generalizes reference numerals with alphabetical characters unless otherwise specified.

A description will now be given of the operation of the desktop type PC 200. When the user executes a program stored in a hard disc (not shown) accommodated in the body 210 by manipulating the keyboard 230 or mouse 240, the CPU 40 downloads necessary data from the hard disk to the memory (not shown). At this time, the chip set 20 controls communications between the CPU 40 and the memory. The heat at the time of control is radiated by the natural cooled system by the heat conduction part 134, cooling systems by the heat sink 50 and the sheet metal 90, etc., and the chip set 20 may provide stable and high speed operations.

Further, the present invention is not limited to these preferred embodiments, and various variations and modifications may be made without departing from the scope of the present invention. For example, the chip set is not limited to that located between the CPU and the memory, and the present invention is broadly applicable to exoergic circuit elements.

INDUSTRIAL APPLICABILITY

The retention module, heat sink, and electronic apparatus as one aspect of the present invention serve to radiate the heat from a chip set, and thermally protect the chip set for stable operations. The circuit structure and electronic apparatus of another aspect of the present invention use the first and second radiating parts to radiate the heat from the first and second circuit elements and protect these circuit elements for stable operations.

What is claimed is:

1. A retention module comprising:
   a holding part for holding a CPU;
   a first connecting part connectible thermally to a chip set that is connectible electrically to the CPU; and
   a heat conduction part, connected to said first connecting part, for transmitting heat from the chip set to the outside, through the holding part.

2. A retention module according to claim 1, further comprising a heat radiating part, connected to the heat conduction part, for radiating heat from the chip set and the CPU.

3. A retention module according to claim 1, wherein the heat conduction part is thermally connected to a heat radiating part for radiating heat from the CPU.

4. A retention module according to claim 1, wherein the heat conduction part radiates the heat from the CPU.

5. A retention module according to claim 1, wherein the heat conduction part includes a heat pipe.

6. A retention module according to claim 1, further comprising a second connecting part, arranged approximately parallel to a substrate, for electrically connecting the CPU to the substrate.

7. A retention module according to claim 1, further comprising a second connecting part, arranged approximately perpendicular to a substrate, for electrically connecting the CPU to the substrate.

8. A circuit structure comprising:
   a substrate;
   first and second exoergic circuit elements connectible electrically to each other through said substrate;
   a holding mechanism for fixing said first circuit element onto said substrate and for electrically connecting said first circuit element to said substrate;
   a first heat radiating part, connected to said holding mechanism, for radiating heat from said first circuit element; and
   a second heat radiating part, connected to the holding mechanism, for radiating heat from said second circuit element.

9. A heat sink comprising:
   a connecting part connected to a chip set; and
   a heat conduction part, connected to said connecting part, for transmitting heat from the chip set to the outside.

10. An electronic apparatus comprising:
    a housing;
    a substrate housed in said housing;
    a CPU provided on the substrate;
    a memory for communicating with said CPU;
    a chip set, provided on the substrate between said CPU and memory, for controlling operations of said CPU and memory;
    a retention module for fixing said CPU onto said substrate and for electrically connecting said CPU to said substrate,
    wherein said retention module includes:
    a first connecting part connected to the chip set; and
    a heat conduction part, connected to said first connecting part, for transmitting heat from the chip set to the outside.

11. An electronic apparatus according to claim 10, further comprising a sheet metal provided in said housing and connecting thermally to said heat conduction part, said sheet metal supporting said housing.

12. An electronic apparatus comprising:
    a housing;
    a substrate housed in said housing;
    first and second exoergic circuit elements connectible electrically to each other through said substrate;
    a holding mechanism for fixing said first circuit element onto said substrate and for electrically connecting said first circuit element to said substrate;
    a first heat radiating part, connected to said holding mechanism, for radiating heat from said first circuit element; and
    a second heat radiating part, connected to the holding mechanism, for radiating heat from said second circuit element.

* * * * *